US012672308B2

(12) United States Patent
Barlage et al.

(10) Patent No.: US 12,672,308 B2
(45) Date of Patent: Jun. 30, 2026

(54) THIN-FILM TRANSISTORS WITH GATE-SOURCE CAPACITANCE TUNING

(71) Applicant: ZINITE CORPORATION, Edmonton (CA)

(72) Inventors: Douglas W. Barlage, Edmonton (CA); Viraj Bhingardive, Edmonton (CA); Korel Dawkins, Edmonton (CA); Alex Ma, Edmonton (CA); Eric Wilson Milburn, Edmonton (CA); Lhing Gem Shoute, Edmonton (CA)

(73) Assignee: ZINITE CORPORATION, Edmonton (CA)

( * ) Notice: Subject to any disclaimer, the term of this patent is extended or adjusted under 35 U.S.C. 154(b) by 0 days.

(21) Appl. No.: 19/274,412

(22) Filed: Jul. 18, 2025

(65) Prior Publication Data

US 2025/0351433 A1     Nov. 13, 2025

Related U.S. Application Data

(63) Continuation of application No. PCT/IB2025/051077, filed on Jan. 31, 2025.

(60) Provisional application No. 63/627,983, filed on Feb. 1, 2024.

(51) Int. Cl.
    *H10D 30/67*        (2025.01)
    *H10D 30/01*        (2025.01)

(52) U.S. Cl.
    CPC ..... *H10D 30/6706* (2025.01); *H10D 30/0314* (2025.01); *H10D 30/6731* (2025.01); *H10D 30/6736* (2025.01); *H10D 30/6757* (2025.01)

(58) Field of Classification Search
    CPC .... H10N 50/01; H10K 10/46; H10D 30/6706; H10D 30/6713; H10D 30/6728; H10D 30/673; H10D 30/6733; H10D 30/6755; H10D 30/6757; H10B 51/30; H10B 53/30; H10B 61/22; H01L 21/76876
    See application file for complete search history.

(56) References Cited

U.S. PATENT DOCUMENTS

| | | | |
|---|---|---|---|
| 8,536,636 | B2 | 9/2013 | Englekirk |
| 8,835,909 | B2 | 9/2014 | Han et al. |
| 2008/0315200 | A1 | 12/2008 | Kim et al. |

(Continued)

FOREIGN PATENT DOCUMENTS

| | | |
|---|---|---|
| CN | 116207160 A | 6/2023 |
| WO | WO-2023285936 A1 | 1/2023 |

*Primary Examiner* — Edward Chin
(74) *Attorney, Agent, or Firm* — PERRY + CURRIER

(57)            ABSTRACT

An example thin-film transistor includes a source and a gate. The source includes a body of source metal and a body of capacitance-tuning material disposed on the body of source metal. The body of capacitance-tuning material is config-ured to control a capacitance between the source and the gate. A drain of the thin-film transistor may also include a body of capacitance-tuning material. Capacitance-tuning material may be provided outside the source/drain, for example, adjacent a gate dielectric material. The thin-film transistor may further include a body of reducing material to draw oxygen out of other materials of the thin-film transis-tor. The thin-film transistor may further include a body of hardmask material used during the making of the thin-film transistor.

18 Claims, 9 Drawing Sheets

(56)     References Cited

U.S. PATENT DOCUMENTS

| | | | | |
|---|---|---|---|---|
| 2009/0256203 A1* | 10/2009 | Kisdarjono | ........ | H10D 30/6757 |
| | | | | 257/365 |
| 2018/0307107 A1* | 10/2018 | Lee | ................... | G02F 1/136286 |
| 2020/0279932 A1 | 9/2020 | Nidhi et al. | | |
| 2022/0271047 A1* | 8/2022 | Liao | ....................... | H10B 51/30 |
| 2022/0336671 A1 | 10/2022 | Dai et al. | | |
| 2023/0065619 A1* | 3/2023 | Yu | .......................... | H10K 10/46 |
| 2024/0136354 A1* | 4/2024 | Park | .................... | H10D 62/121 |
| 2024/0213370 A1* | 6/2024 | Barlage | ............. | H10D 30/6713 |

* cited by examiner

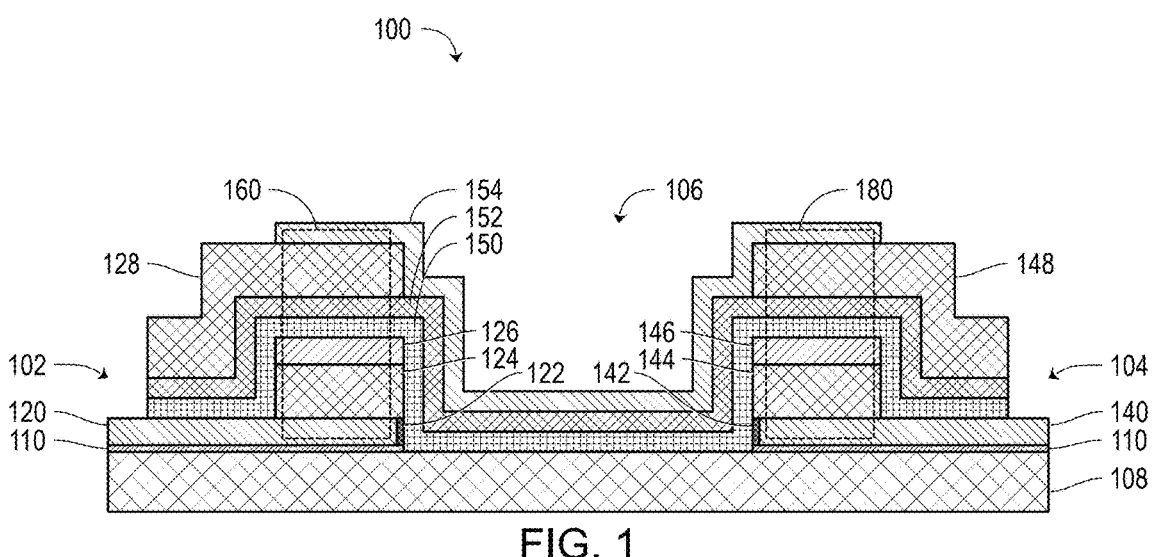
FIG. 1
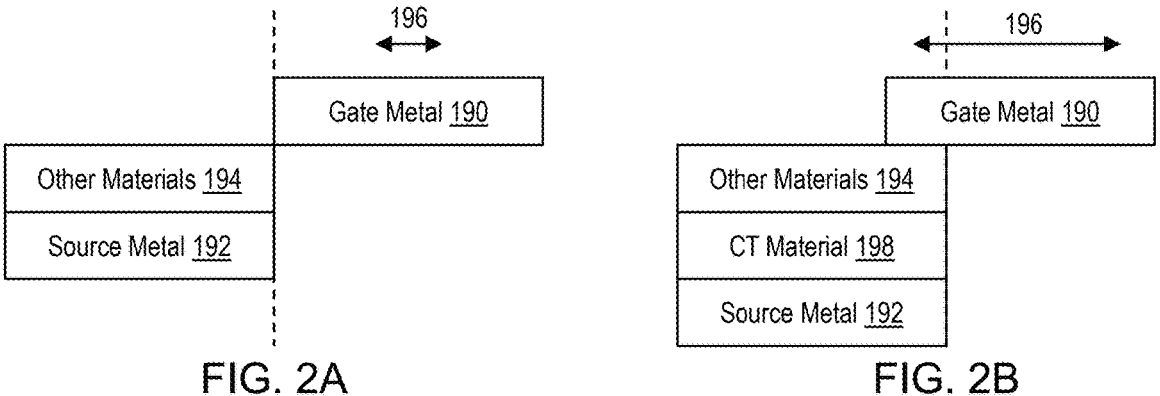
FIG. 2A                    FIG. 2B

THIN-FILM TRANSISTORS WITH GATE-SOURCE CAPACITANCE TUNING

CROSS-REFERENCE TO RELATED APPLICATIONS

This application is a continuation of copending International Application No. PCT/IB2025/051077, filed Jan. 31, 2025, which claims priority to and the benefit of U.S. provisional patent app. No. 63/627,983, filed Feb. 1, 2024. The entire contents of the foregoing are incorporated herein by reference.

FIELD OF THE INVENTION

The present invention relates to thin-film transistors.

BACKGROUND

Thin-film transistors (TFTs) are presently widely employed in semiconductor devices. TFTs get their name from the fact that they are typically fabricated from very thin layers of semiconductor materials, metals, and insulators.

Typically TFTs are not manufactured in the conventional, front end of line (FEOL), manufacturing processes which are the processes used to manufacture integrated circuits of complementary metal-oxide-semiconductor (CMOS) circuitry. This has limited the manufacture and use of TFTs within broader semiconductor fabrication processes and use cases.

SUMMARY

The present invention provides thin-film transistors which can be fabricated at extended front-end-of-line (xFEOL), middle-end-of-line (MEOL), back-end-of-line (BEOL), and/or back-side (BSide) manufacturing stages and whose gate and source are insensitive to misalignment, among other features and advantages.

According to an aspect of the present invention, a thin-film transistor includes a source and a gate. The source includes a body of source metal and a body of capacitance-tuning material disposed on the body of source metal. The body of capacitance-tuning material is configured to control a capacitance between the source and the gate.

According to another aspect of the present invention, a method of making a thin-film transistor includes forming a source and forming a gate. Forming the source includes forming a body of source metal and forming a body of capacitance-tuning material on the body of source metal. The body of capacitance-tuning material is configured to control a capacitance between the source and the gate.

BRIEF DESCRIPTION OF THE DRAWINGS

Preferred embodiments of the present invention will now be described, by way of example only, with reference to the attached figures which are not drawn to scale, wherein:

FIG. 1 is a cross-sectional view of an example thin-film transistor in accordance with the present invention;

FIG. 2A is a schematic diagram of a requirement for alignment of source and gate;

FIG. 2B is a schematic diagram of a capacitance-tuning material relaxing or removing a requirement for alignment of source and gate in accordance with the present invention;

DETAILED DESCRIPTION OF THE INVENTION

Figure 3A:
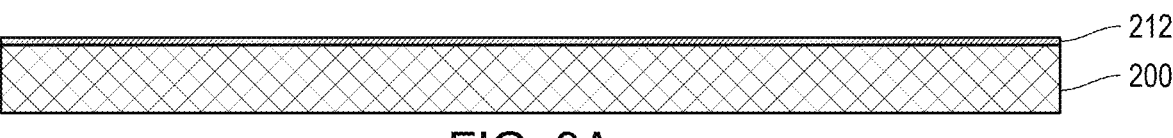
FIGS. 3A-3T are cross-sectional views of an example method of manufacturing a thin-film transistor in accordance with the present invention.
Figure 3B:
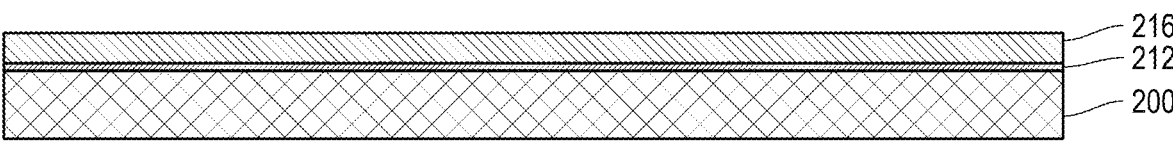

The present invention concerns, among other things, reducing parasitic capacitance mismatch that limits utility in non-self-aligned processes. Capacitance-tuning material is provided to a thin-film transistor to control (e.g., reduce) a capacitance between a source and a gate. A drain may also include capacitance-tuning material. In addition, reducing material may be provided to the source and/or drain, in order to draw oxygen out of other materials. Further, a mask may be used during the making of a TFT and mask material may remain in the TFT.

FIG. 1 shows an example TFT 100 according to the present invention. In various examples, the TFT 100 may be manufactured using extended front-end-of-line (xFEOL), middle-of-line (MOL), back-end-of-line (BEOL), and/or back-side (BSide) processes.

The TFT 100 includes a source 102, drain 104, and gate 106.

The TFT 100 is formed with a planar substrate 108. The substrate 108 may be disposed over another layer of transistors, whether manufactured in accordance with the present invention or by another technique, such as CMOS processes.

Examples of materials for the substrate 108 include silicon dioxide; silicon nitride; glass; fluorosilicate glass (FSG); a silicon wafer whose surface is processed with wet thermal oxide (WTO) or similar treatment; carbon doped oxide (CDO); organic polymers such as perfluorocyclobutane or polytetrafluoroethylene; organosilicates such as silsesquioxane, siloxane, organosilicate glass; flexible polymer; plastic; etc. Suitable combinations of such materials may also be used.

The TFT 100 may include a layer of adhesion material 110 formed on the substrate 108. Adhesion material 110 may include titanium nitride (TiN), zirconium nitride (ZrN), or hafnium nitride (HfN). The layer of adhesion material 110 promotes adhesion of material, such as source/drain material, to the substrate 108. If adhesion is not a concern, the adhesion layer 110 may be omitted.

The source 102 is formed of a body of source material 120, which in this example may be tungsten, ruthenium, molybdenum, cobalt, tantalum, nickel, copper, etc. Heavily doped n-type materials may be used and, in some circumstances, other materials may be used as the source material 120. Further examples of source material 120 include degenerate n-type silicon, germanium, and/or other compound semiconductors with high conductivity with predominately n-type or electron transport. In this example, the source material 102 is ruthenium.

The source material 120 may be treated to form a source-channel interface 122, which includes p-type semiconductor material that faces inward towards the gate 106 and contacts semiconductor channel material 150. The source-channel interface 122 is optional and may be omitted if its function is not desired.

The source-channel interface 122 is useful to increase the threshold voltage at which TFT 100 turns on, making the TFT 100 operate in enhancement mode, to reduce leakage current through TFT 100 in the off state.

Specifically, source-channel interface 122 is provided to create a repository of complimentary excess positive charge that functions to deplete the channel in at least the region of channel material 150 adjacent the source material 120. In this manner, source-channel interface 122 serves as a voltage-controlled electron transport barrier, resulting in substantially less current flow through channel material 150 when TFT 100 is off.

Further, source-channel interface 122 may also serve to reduce stress induced leakage currents ("SILC") in TFT 100 by inhibiting the formation of interlayer stress-induced flaws between channel material 150 and source material 120.

Treatment of the source material 120 may be performed to obtain the source-channel interface 122. Example treatments include plasma treatment and atomic layer deposition ALD. In this example, the source material 120 is created by treating the source material with oxygen plasma, as will be further discussed below. The resulting source-channel interface 122 includes oxidized source material 120, which in this example is ruthenium oxide ($RuO_2$). In other examples, source-channel interface 122 may be formed in a variety of configurations, such as an induced piezoelectric dipole, a controllable tunneling barrier, or other mechanisms to modulate injected current by an externally applied field. Combinations of such treatments may be used.

In various examples, when implemented as a p-type semiconductor, source-channel interface 122 may include an oxide or a sulfide of the source material 120. In other examples, source-channel interface 122 may include elemental germanium or source-channel interface 122 may be formed by using a p-type dopant in a relevant portion of channel material 150. In other examples, source-channel interface 122 includes another element of group 6 (also known as group VI A), such as silicon nitride, nickel oxide, copper oxide, molybdenum oxide, iridium oxide, or a metal ion paired with a chalcogen, such as oxygen, sulfur, selenium, or tellurium compounds.

Source-channel interface 122 may alternatively or additionally be formed by a catalytic growth of source material 120, such as ruthenium and ruthenium oxide, tungsten and tungsten oxide, other metals that form self-limiting oxide layers, or degeneratively doped polycrystalline silicon in combination with a chemically limited silicon dioxide or a nitride barrier layer.

In examples that include oxidizing the source material to obtain the interface 122, the oxygen may preferentially traverse source material 120 to form interface 122. Metals that do not normally form self-limiting oxides, such as molybdenum, may be used provided that the formation or treatment process includes a step to limit oxidation. In other examples, source-channel interface 122 may be formed by depositing a p-type material, such as a p-type metal oxide or another semiconductor, by way of a deposition technique, such as atomic layer deposition, sputtering, chemical vapor deposition, or plasma enhanced chemical vapor deposition.

The source 102 further includes a body of capacitance-tuning material 124 positioned above the body of source material 120. The capacitance-tuning material 124 is a dielectric or insulator that has a low relative permittivity (low dielectric constant). Examples of capacitance-tuning material 124 include silicon dioxide ($SiO_2$) and silicon dioxide that is doped (e.g., with carbon, fluorine, etc.) to further reduce its relative permittivity. The capacitance-tuning material 124 helps control the capacitance between the source 102 and gate 106, as will be discussed further below.

The source 102 may further include a body of supplementary material 126 positioned above the body of capacitance-tuning material 124. Examples of supplementary materials include titanium, tin, hafnium, zirconium and other metals that form a conducting oxide. The supplementary material 126 may serve one or more functions. When the TFT 100 annealed during manufacture, the supplementary material 126 may draw oxygen out of other materials of the TFT, such as the semiconductor channel material 150. As oxygen deficiencies accumulate, the channel material 150 may become more heavily n-type, which is desirable. With this function, the body of supplementary material 126 may be considered a body of reducing material. Additionally or alternatively, the supplementary material 126 may be used as a mask during manufacture of the TFT 100. When such function is useful, the supplementary material 126 may be considered a body of mask material. The supplementary material 126 may be used for both such functions in the same TFT 100. In various examples, the body of supplementary material 126 may be about 1 or 2 nm thick. The body of supplementary material 126 is optional and, if neither of these functions are desirable, it may be omitted.

The drain 104 may have the same or similar material and/or structure as the source 102. In this example, the drain 104 is formed of a body of drain material 140, which may be treated to form a drain-channel interface 142, a body of capacitance-tuning material 144, and a body of supplementary material 146. Details of such will not be repeated here and the description of source material 120, source-channel interface 122, body of capacitance-tuning material 124, and body of supplementary material 126 may be referenced. In other examples, the drain 104 has a material and/or structure different to the source 102.

The TFT 100 further includes a body of semiconductor channel material 150 disposed between the source 102 and drain 104. The channel material 150 is an n-type oxide semiconductor, preferably a metal oxide. In this example, the channel material 150 is disposed between the source 102 and drain 104 and over portions of the source material 120 including the source-channel interface 122, the capacitance-tuning material 124 at the source 102, the supplementary material 126 at the source 102, the substrate 108, the supplementary material 146 at the drain 104, the capacitance-tuning material 144 at the drain 104, and the drain material 140 including the drain-channel interface 142.

Examples of the channel material 150 include tin oxide ($SnO_2$) and zinc oxide (ZnO). In this example, the body of channel material 150 is a layer of polycrystalline tin oxide (with crystallinity of 70% or greater) about 5 nm to about 10 nm thick with a preferred crystallite orientation of Miller index <110>, as determined using grazing-incidence x-ray diffraction (GI-XRD) with $\omega = 0.5°$ on 40 nm thick samples.

The TFT 100 further includes a body of gate dielectric material 152 disposed over the channel material 150. The gate dielectric material 152 may be formed of a high-κ dielectric, such as hafnium oxide ($HfO_2$). Other examples of gate dielectric materials 152 include silicon dioxide ($SiO_2$), silicon nitride ($S_3iN_4$), zirconium oxide ($ZrO_2$), and aluminum oxide ($Al_2O_3$) and combinations thereof.

The TFT 100 further includes a body of gate material 154 (gate metal) disposed over the gate dielectric material 152. The gate material 154 may be tungsten, titanium, molybdenum, gold, platinum, aluminum, nickel, copper, chromium, hafnium, indium, manganese, iron, vanadium, zinc, tantalum, or combination/alloy thereof.

A body of encapsulation material 128 may be provided at the source 102 extending at least between a portion of the body of gate dielectric material 152 and a corresponding portion of channel material 150. An identical or similar body of encapsulation material 148 may be provided at the drain 104 at least between another portion of the body of gate dielectric material 152 and a corresponding portion of channel material 150. One function of the encapsulation material 128, 148 is to electrically insulate materials. Examples of encapsulation material 128, 148 include polyamide, spin-on-glass, low-κ dielectric, and suitable materials discussed for the substrate 108. Encapsulation material 128, 148 is optional.

The purpose of the source-side capacitance-tuning material 124 and the encapsulation material 128, if used, is to control the gate-source capacitance at a "stack" of layers at the source 102, as indicated at 160. Controlling the gate-source capacitance is generally contemplated to be reducing or minimizing the capacitance. However, the techniques discussed herein may also be used to increase the capacitance or tailor the capacitance to a desired value with a suitable selection and configuration of source-side capacitance-tuning material 124 and/or encapsulation material 128. Note that, when encapsulation material 128 is used as capacitance-tuning material, it may also be referred to as capacitance-tuning material. Further, material that does not serve an encapsulation purpose, but that has the same or similar configuration and position as the described encapsulation material 128, may also be termed capacitance-tuning material. Lastly, examples in accordance with the present invention include one or both of the source-side capacitance-tuning material 124 and the encapsulation material 128 (acting as capacitance-tuning material).

Overlap of gate material 154 and source material 120, which are generally metal or metal-like materials, results in capacitance at the stack 160 that may affect operation of the TFT 100, such as reducing the ability of the TFT 100 to drive loads. In other devices, it is possible to control this capacitance by reducing or eliminating this overlap by, for example, limiting or omitting overlapping gate material 154 at this location. However, this often requires maintaining very fine photoresist/mask positioning tolerances. When this is not possible or desirable, the capacitance-tuning material 124 may be configured to reduce the gate-source capacitance and its undesirable effects.

This is shown schematically in FIGS. 2A and 2B. In many conventional designs, gate metal 190 is aligned with source metal 192, as shown in FIG. 2A, to reduce or minimize overlap, so as to reduce or minimize the resulting gate-source capacitance. In the example depicted, opposing faces of the gate metal 190 and source metal 192 terminate at the same dashed line, which means these materials 190, 192 are as close as possible without overlap. Intervening materials 194, such as gate dielectric and/or semiconductor materials, may help reduce the gate-source capacitance, but the configuration and properties of these other materials 194 are often governed by other requirements. Hence, in many conventional designs, the tolerance 196 in positioning the mask/photoresist that defines the relative positions of the gate metal 190 and source metal 192 must be kept as low as possible, so as to avoid or at least predictably control overlap.

With reference to FIG. 2B, the present invention provides a capacitance-tuning material 198 between the gate metal 190 and source metal 192, so as to reduce or minimize the resulting gate-source capacitance. As such, the tolerance 196 in positioning the mask/photoresist can be relaxed or, in many cases, unrestricted overlap of the gate metal 190 and source metal 192 can be permitted, as shown in the example of FIG. 1. Relaxing or eliminating the need to closely align the gate metal 190 and source metal 192 simplifies the manufacture of such TFTs.

Returning to FIG. 1, the overlap capacitance, $C_{ov}$ of the stack 160 can be approximately described by the following relation:

$$C_{ov} = \frac{1}{\left(\frac{\varepsilon_{rGD}}{t_{GD}}\right)^{-1} + \left(\frac{\varepsilon_{rCT}}{t_{CT}}\right)^{-1} + \left(\frac{\varepsilon_{rEM}}{t_{EM}}\right)^{-1}}$$

where:

$\varepsilon_{rGD}$ is the relative permittivity (dielectric constant) of the gate dielectric material 152;

$t_{GD}$ is the thickness of the layer of gate dielectric material 152;

$\varepsilon_{rCT}$ is the relative permittivity of the capacitance-tuning material 124;

$t_{CT}$ is the thickness of the layer of capacitance-tuning material 124;

$\varepsilon_{rEM}$ is the relative permittivity of the encapsulation material 128; and $t_{EM}$ is the thickness of the layer of encapsulation material 128.

The selection and configuration of the gate dielectric material 152 may be governed by other concerns, such as the desired on/off electrical characteristics of the TFT 100. As such, the relative permittivity, $\varepsilon_{rGD}$, and/or thickness, $t_{GD}$, of the gate dielectric material 152 may not be sufficiently customizable to control the overlap capacitance, $C_{ov}$, of the stack 160. Hence, the material and thickness of the capacitance-tuning material 124 can be selected and configured to control the capacitance, $C_{ov}$, of the stack 160.

The ratio of relative permittivity, $\varepsilon_{rCT}$, and thickness, $t_{CT}$, of the capacitance-tuning material 124 influences the capacitance, $C_{ov}$, of the stack 160, and this ratio can be selected to achieve the desired tuning effect, such as reducing or minimizing the capacitance, $C_{ov}$. The relation between the relative permittivity, $\varepsilon_{rCT}$, and thickness, $t_{CT}$, may be used to customize the effect. For instance, selecting a capacitance-tuning material 124 with a lower relative permittivity, $\varepsilon_{rCT}$, allows the thickness, $t_{CT}$, of the capacitance-tuning material 124 to be thinner. Conversely, increasing the relative permittivity, $\varepsilon_{rCT}$, of the capacitance-tuning material 124 requires an increase in thickness, $t_{CT}$, to achieve the same effect.

The material and thickness of the encapsulation material 128, if used, can be controlled in the same way to achieve a comparable effect. If the encapsulation material 128 is not used, then the capacitance-tuning material 124 can be used exclusively to control the capacitance, $C_{ov}$, of the stack 160. If the encapsulation material 128 is used, its material and thickness may be determined by other factors, in which case the capacitance-tuning material 124 can be the dominant or exclusive way of controlling the capacitance, $C_{ov}$, of the stack 160. However, in various examples, the material and/or thickness of the encapsulation material 128 may adjustable, in which case both the capacitance-tuning material 124 and the encapsulation material 128 can be used to control the overlap capacitance, $C_{ov}$, of the stack 160.

The same principles apply to a comparable capacitive stack 180 at the drain 104. The capacitance-tuning material 144 and, optionally, the encapsulation material 148 can be used in the same general manner, as discussed above, to control the capacitance, $C_{ov}$, of the drain-side stack 180. However, in various examples, it may be sufficient to control the capacitance, $C_{ov}$, of the source-side stack 160. As such, the drain-side capacitance-tuning material 144 and/or encapsulation material 148 may be omitted.

Likewise, if either or both are used, the drain-side capacitance-tuning material 144 and/or encapsulation material 148 may help control the drain-source capacitance of the stack of layers 180 at the drain 104.

Figure 3C:
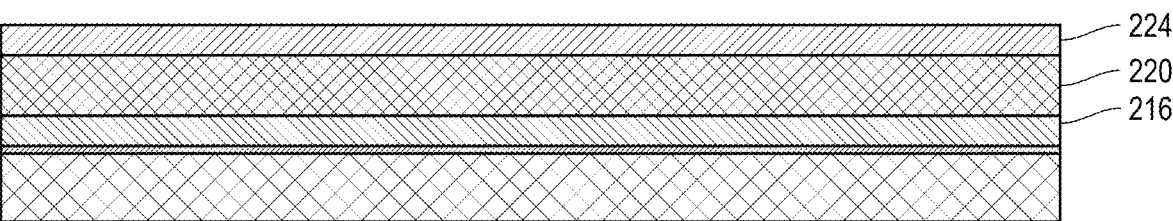
Figure 3D:
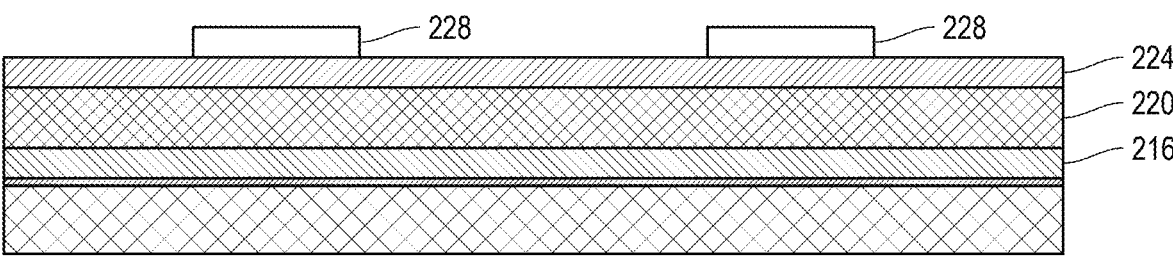
Figure 3E:
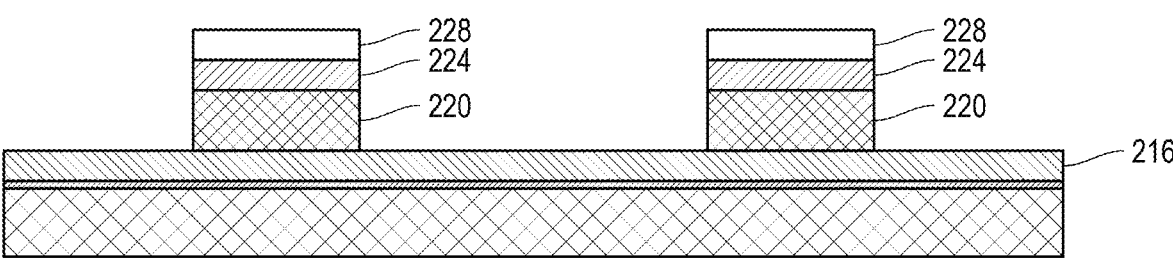
Figure 3F:
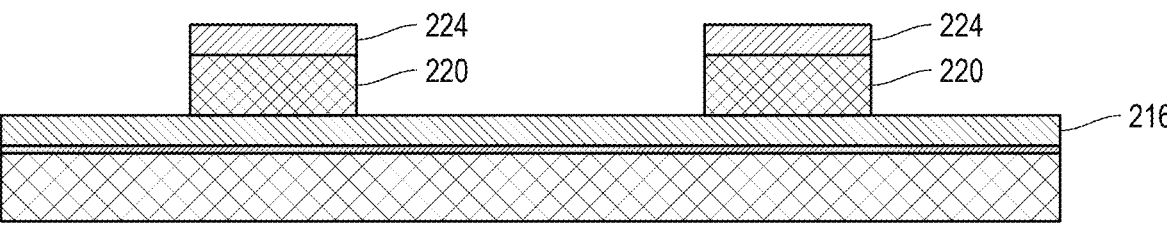
Figure 3G:
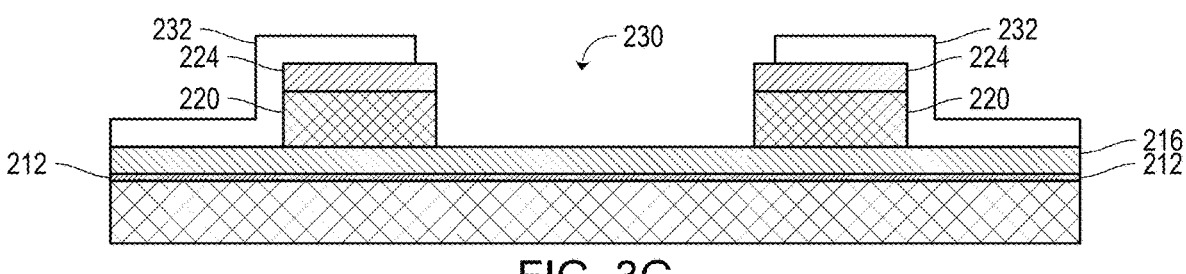
Figure 3H:
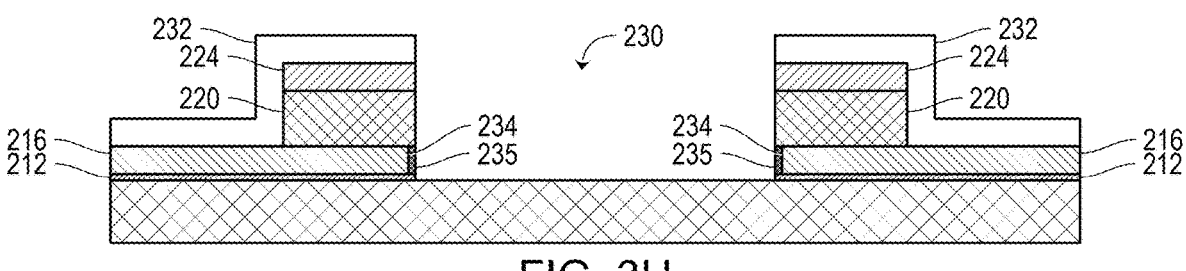
Figure 3I:
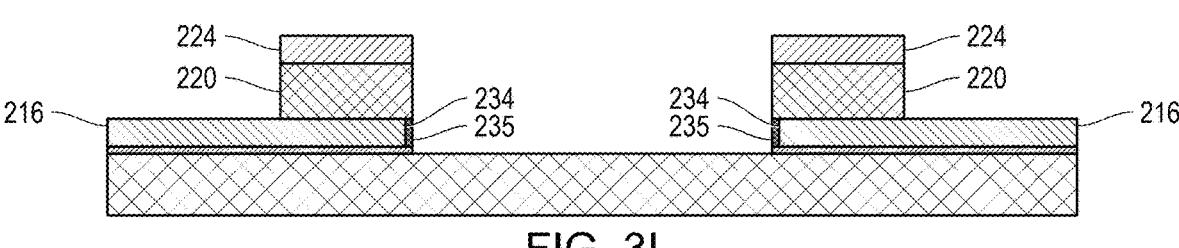
Figure 3J:
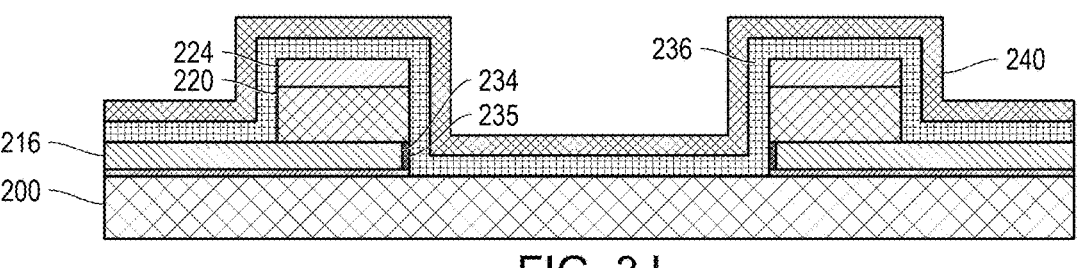
Figure 3K:
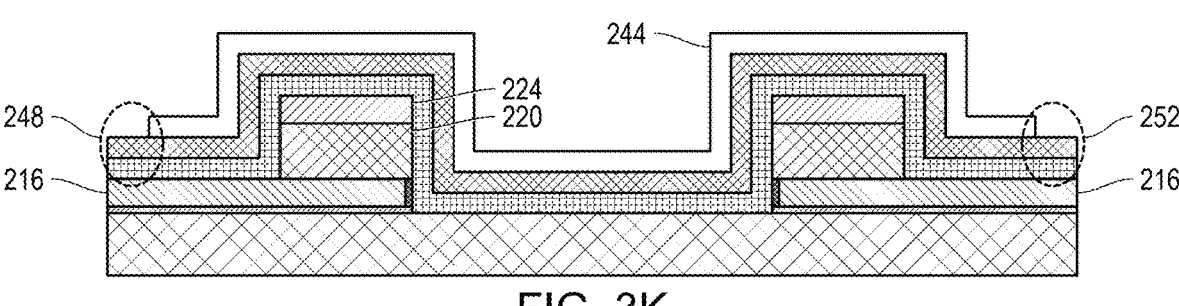
Figure 3L:
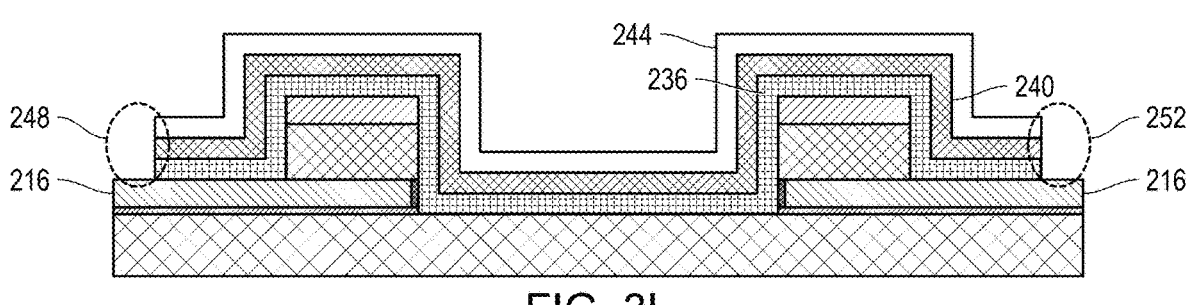
Figure 3M:
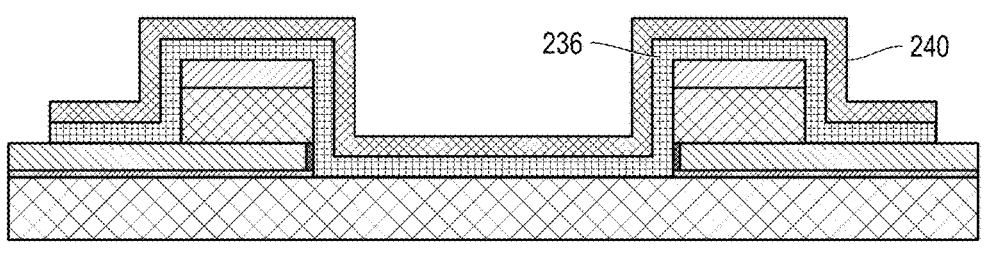
Figure 3N:
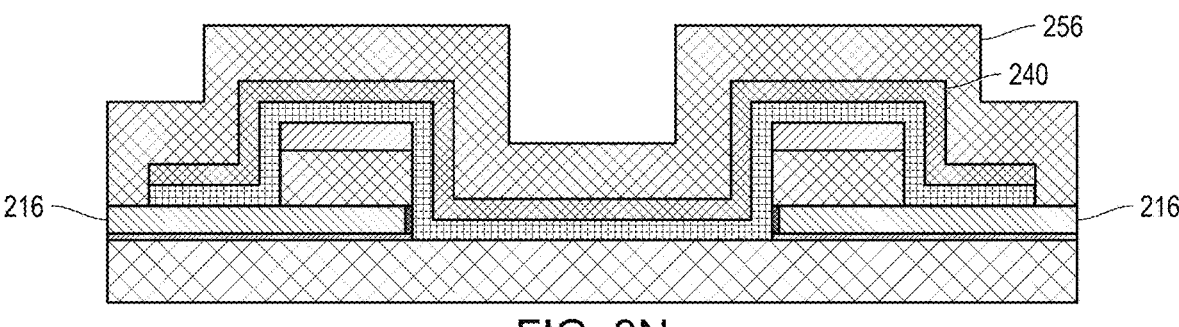
Figure 3O:
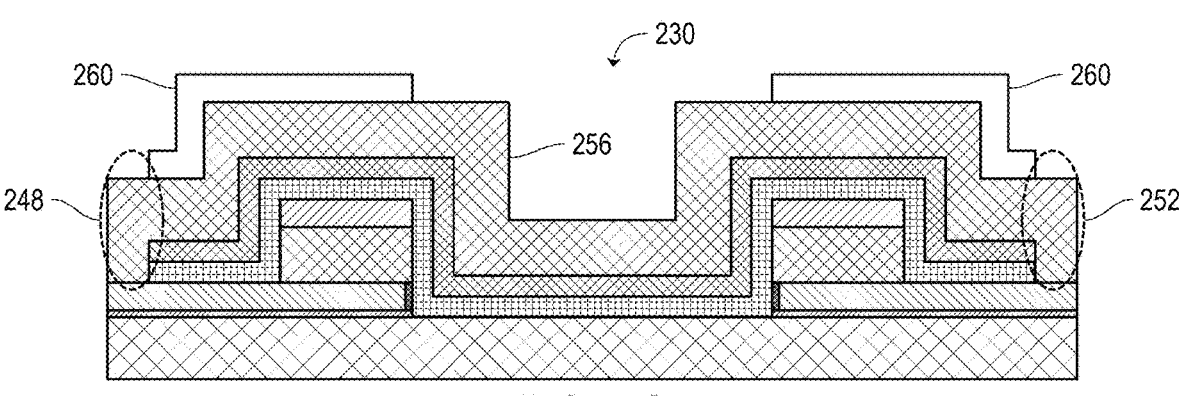
Figure 3P:
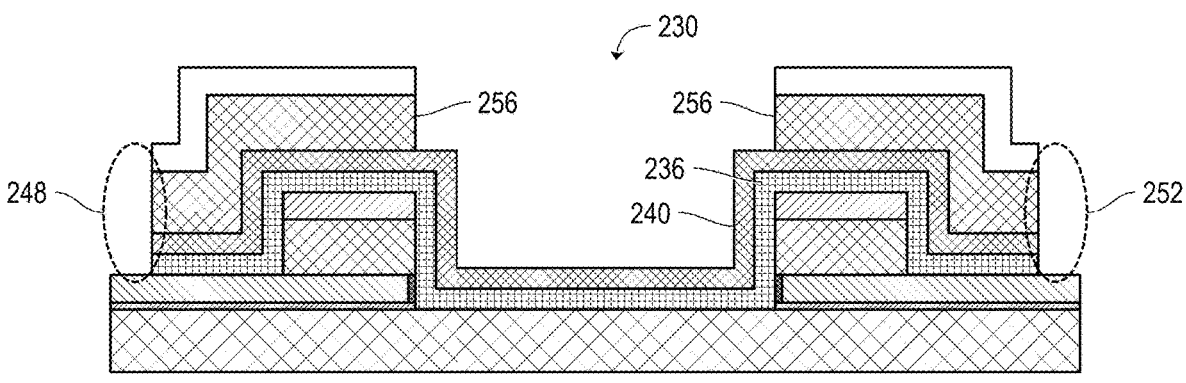
Figure 3Q:
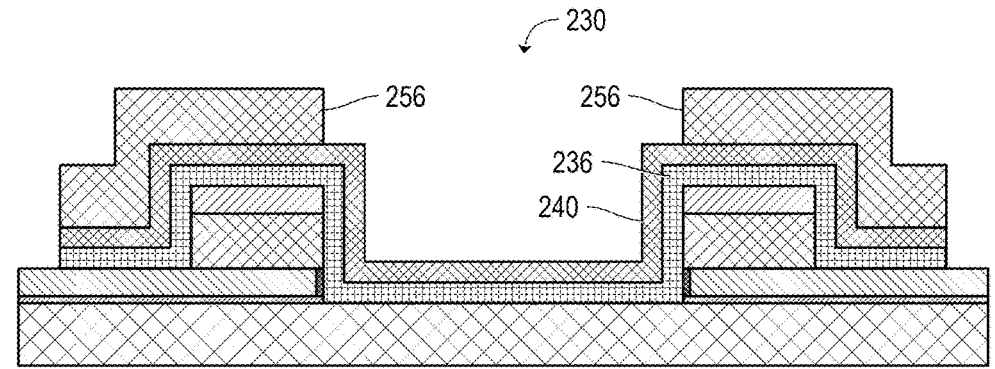
Figure 3R:
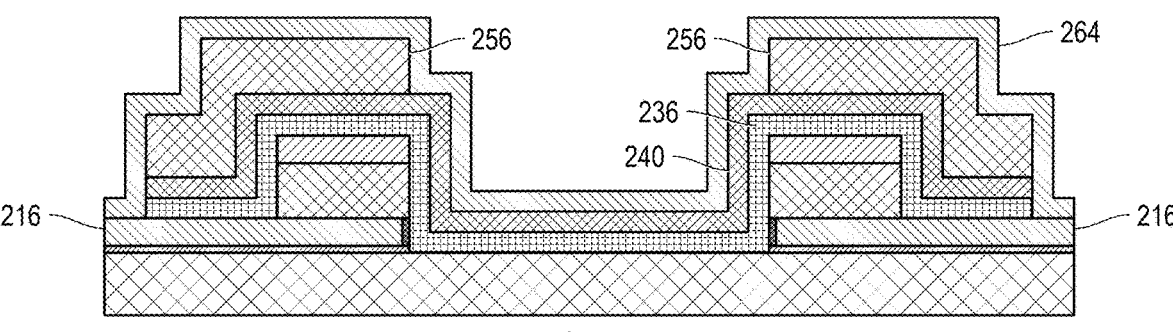
Figure 3S:
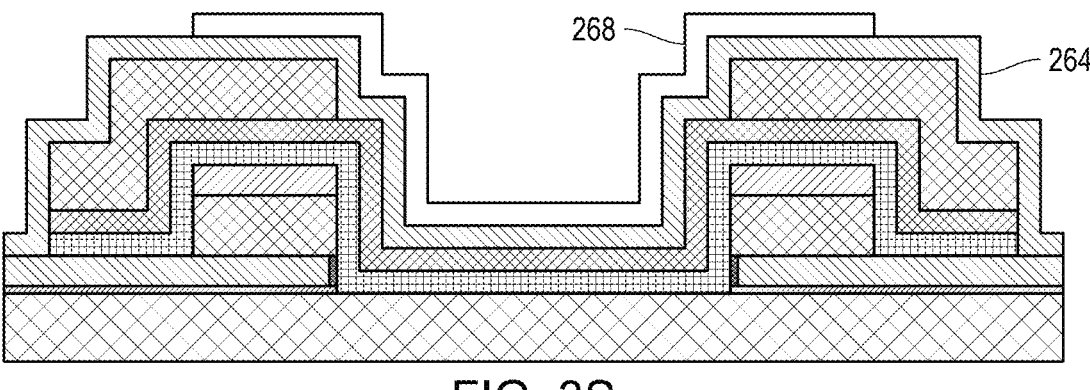
Figure 3T:
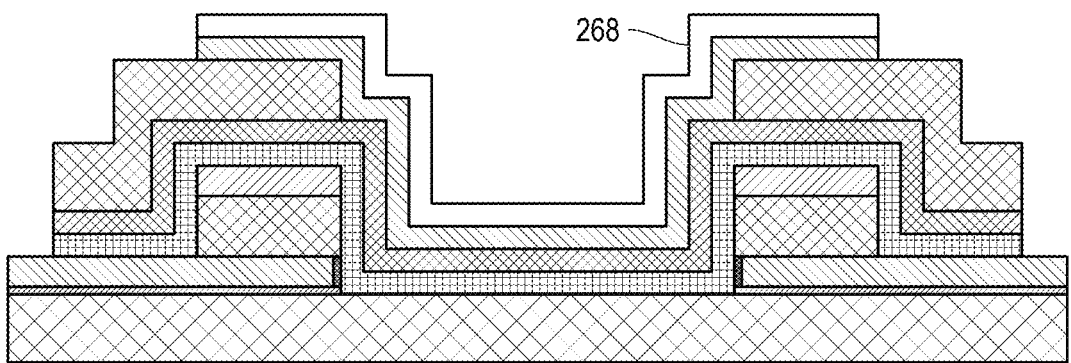

With reference to FIGS. 3A-3T, a method of manufacturing TFTs, such as the TFT 100 and other TFTs discussed herein, will now be described.

The method generally includes four stages, namely: formation of the source and drain; formation of the source and drain pillars; formation of the semiconductor material and gate dielectric; and formation of the gate. An example of each of these fabrication stages is described below, with reference to FIGS. 3A-3T.

The manufacture of materials, layers, and/or features of semiconductor devices is referred to herein as "forming." As will be apparent to those of ordinary skill in the art, unless otherwise mentioned, "forming" is intended to include all semiconductor manufacturing techniques suitable and applicable therefor including, without limitation, deposition (e.g., chemical vapor deposition or CVD, atomic layer deposition or ALD, physical vapor deposition or PVD, etc.), plasma-enhanced/assisted atomic layer deposition (PEALD/PAALD), thermal ALD (T-ALD), plasma-enhanced chemical vapor deposition (PECVD), sputtering, lithography/photolithography, etching, implantation, annealing, oxidation, and similar processes. While examples of specific types of forming are given below, it should be understood that comparable processes of forming may alternatively or additionally be used, unless otherwise mentioned, without departing from the present invention.

As illustrated in FIG. 3A, the method starts with the formation of the source and drain on a prepared substrate on which the TFT 100 is to be formed. As mentioned above, it is contemplated that TFTs in accordance with the present invention can be formed on a variety of substrates, including glass, flexible polymers and/or plastic, etc., in addition to silicon wafers and/or formed over other layers of TFTs formed in accordance with the present invention or by other techniques. In the illustrated example, a substrate 200 includes a silicon wafer whose surface has been processed to form a layer of wet thermal oxide (WTO), although any other insulator, preferably with a low dielectric constant, can be employed instead of WTO, as discussed above.

An adhesion layer 212 may be formed on the substrate 200. The adhesion layer 212 promotes adhesion of material, such as source/drain material, to the substrate 200. The adhesion layer 212 may be omitted if adhesion is otherwise acceptable. See above for example adhesion materials.

Next, a layer of source/drain material 216 (e.g., ruthenium) is formed, for example by sputtering, on the adhesion layer 212, if used, or generally on the substrate 200. The source/drain material 216 ultimately becomes the bodies of source and drain material 120, 140 of the TFT 100.

In the illustrated example of FIGS. 3A-3T, both the source and drain of the TFT 100 are formed from the same material. However, in other examples, the source and drain may be formed of different materials. In such examples, the area of the desired material for the source can be formed adjacent an area formed of a different desired material for the drain, both areas and materials being formed on the substrate 200 or adhesion layer 212, if used.

The next stage in the fabrication is the formation of the source and drain "pillars". In FIG. 3C, the method proceeds with a layer of capacitance-tuning material 220 being formed. The capacitance-tuning material 220 is formed on the layer of source/drain material 216. As mentioned above, the capacitance-tuning material 220 is a dielectric or insulating material, preferably with a low relative permittivity (low dielectric constant). Examples of capacitance-tuning material 220 include silicon dioxide and silicon dioxide that is doped (e.g., with carbon, fluorine, etc.) to further reduce its relative permittivity, as discussed above. The capacitance-tuning material 220 may be formed by ALD or similar process. The capacitance-tuning material 220 ultimately forms the bodies of capacitance tuning material 124, 144 of the TFT 100.

Then, a layer of supplementary material 224 is formed, for example by sputtering or evaporation, etc. over the capacitance-tuning material 220. The supplementary material 224 ultimately forms the bodies of supplementary material 126, 146 of the TFT 100.

The method continues, as shown in FIG. 3D, with a pattern of photoresist 228 being formed on the supplementary material 224 or, if the supplementary material is not used, the capacitance-tuning material 220. The pattern of photoresist 228 is formed by an appropriate photolithographic process. Next, the structure of FIG. 3D is etched to obtain the structure shown in FIG. 3E that includes two pillars of capacitance-tuning material 220 and supplementary material 224 on source/drain material 216. Inductively coupled plasma reactive ion etching (ICP-RIE) may be used. These two pillars are beginning to correspond to the eventual source and drain structures 102, 104 of the TFT 100.

Next, the photoresist 228 is removed to obtain the pillar structures illustrated in FIG. 3F.

Another photoresist 232 is then applied to obtain the structure shown in FIG. 3G. Etching is then performed, using a suitable etchant, to etch source/drain material 216 and adhesion layer 212, if used, at a central region 230 of the structure to obtain the pillar structures shown in FIG. 3H.

With regard to the steps shown in FIGS. 3G and 3H, the supplementary material 224 may be used as a hardmask to etch the capacitance-tuning material 220 and/or the source/drain material 216.

Etching with photoresist 232 is isotropic with respect to capacitance-tuning material 220 and selective against the supplementary material 224. Hence, the etching of capacitance-tuning material 220 does not rely on the photoresist 232. The photoresist 232 does not control etching at the middle of the structure; rather the photoresist 232 prevents etching at the left and right extents. This is comparable to a self-aligned process in the sense that, if the photoresist 232 is misaligned, the resulting gate to source capacitance is minimally impacted.

At this point, channel interfaces 235 may be formed. In this example, the structure of FIG. 3H is exposed to plasma to form layers of oxidized material as channel interfaces 235 on inward-facing surfaces 234 of the etched source/drain material 216. The channel interfaces 235 become the source- and drain-channel interfaces 122, 142 of the TFT 100.

To form the channel interfaces 235, a sequence of plasma treatments may be used as follows: argon (~95%) and hydrogen (~5%) plasma for a duration of about 10 seconds; then oxygen plasma for a duration of about 60 seconds; and then nitrogen plasma for a duration of about 30 seconds. The treatment may be performed at a temperature of about 190° C. with a power of about 600 W. Remote plasma processing may be used with a carrier gas, such as argon. This sequence may be repeated two or more times. As discussed above, when ruthenium is used as the source/drain material 216, the resulting channel interfaces 235 include ruthenium oxide.

In other examples, a channel interface 235 is formed by depositing material onto the source and/or drain material 216, rather than plasma-treating the source/drain material as described above.

Subsequently, photoresist 232 is removed to obtain the structure shown in FIG. 3I.

The next stage in the fabrication is the formation of the semiconductor material and the gate dielectric and the method continues, as shown in FIG. 3J. A layer of semi-conductor channel material 236, such as tin oxide or zinc oxide, is formed, preferably via ALD, over the structure. The channel material 236 is formed over and in contact with exposed portions of the source/drain material 216, capaci-tance-tuning material 220, supplementary material 224 (if used), channel interface 235 (if used), and substrate 200. Then, a layer of a gate dielectric material 240, such as hafnium oxide, is formed over and in contact with the semiconductor material 236, again preferably by ALD. The semiconductor material 236 ultimately forms the body of channel material 150 of the TFT 100 and the gate dielectric material 240 ultimately forms the body of gate dielectric material 152 of the TFT 100.

Next, the method continues with photoresist 244 being formed over much of the structure of FIG. 3J, but with photoresist 244 not covering the left and right ends 248, 252 of the structure, as illustrated in FIG. 3K. The photoresist 244 is insensitive to misalignment as the source/drain pillars (i.e., materials 216, 220, 224) are already formed by this stage.

As shown in FIG. 3L, the method continues with the structure being etched to remove the channel and gate dielectric material 236, 240 covering the ends 248, 252 of the source/drain material 216. Exposing ends 248, 252 allows for electrodes to be subsequently formed in contact with source/drain material 216.

Next, photoresist 244 is removed, as shown in FIG. 3M.

The next stage in the fabrication is the formation of the gate. The method continues, as shown in FIG. 3N, with a layer of encapsulation material 256, such as polyamide, spin on glass, etc., being formed over the structure. Encapsula-tion material 256 is formed in contact with exposed portions of the source/drain material 216 and gate dielectric material 240. Encapsulation material 256, if used, ultimately becomes the bodies of encapsulation material 128, 148 of the TFT 100.

It is also contemplated that it may be desired to subse-quently form another plane of TFTs, made in accordance with the present invention, over the structure shown. As such, encapsulation material 256 can be a layer of low-κ dielectric, another substrate 200, or similar material.

Next, photoresist 260 is formed over the structure, as shown in FIG. 3O, leaving encapsulation material 256 at a central region 230 and left/right ends 248, 250 exposed. Etching is performed to remove encapsulation material 256 from these exposed regions to obtain the structure shown in FIG. 3P.

Next, the photoresist 260 is removed, as shown in FIG. 3Q and a layer of gate material 264 is formed over the structure, as shown in FIG. 3R. The gate material 264 is formed over exposed regions of dielectric material 240, encapsulation material 256, channel material 236, and source/drain material 216. As described above, the gate material 264 can be a variety of materials and, in this example, is formed by sputtering. The gate material 264 ultimately becomes the body of gate material 154 of the TFT 100.

Next, as shown in FIG. 3S, photoresist 268 is formed over a central portion of the gate material 264 and the remaining exposed gate material 264 is etched away to obtain the structure of FIG. 3T.

Finally, photoresist 268 is removed to obtain the com-pleted device as shown in FIG. 1.

Depending upon the specific materials selected for vari-ous elements of the TFT produced by the above-described method, it may be desired to perform one or more anneal operations during the method. Determining the need for such anneals and/or when in the method they are performed are within the ordinary skill in the art given the benefit of this disclosure. Annealing may be limited to about 400° C., so as to be compatibly with xFEOL, MEOL, BEOL, and/or BSide processes.

By enabling the formation of circuits of TFTs, in accor-dance with the present invention, as xFEOL, MEOL, BEOL, and/or BSide processes, on top of FEOL fabricated CMOS circuitry, true three-dimensional semiconductor dies, cir-cuits, and devices can be fabricated.

It is contemplated that xFEOL, MEOL, BEOL, and/or BSide-formed circuits comprising TFTs in accordance with aspects of the present invention will be useful for a variety of applications, including SRAM memory cells, implement-ing "dark silicon" power saving strategies and/or to provide a variety of non-core functionalities, such as voltage regu-lators, etc., thus increasing overall densities of semiconduc-tor dies to previously unobtainable levels.

Figure 4:
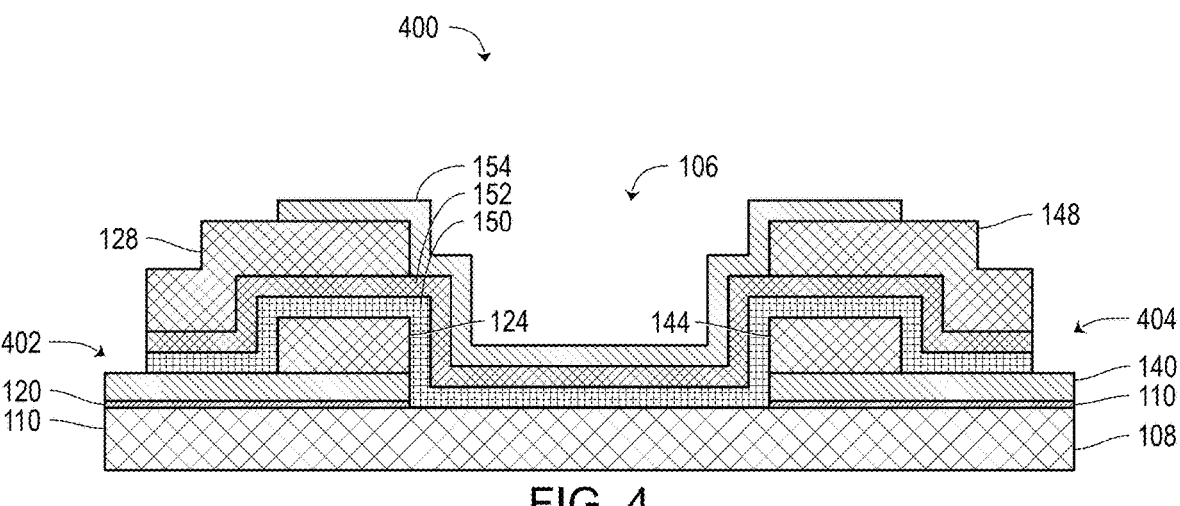
FIG. 4 is a cross-sectional view of another example thin-film transistor in accordance with the present invention.

FIG. 4 shows another example TFT 400 that embodies at least some of the above-described principles of the present invention. In this example, a source 402 omits the source-channel interface 122 of the TFT 100 (FIG. 1) and a drain 404 omits the drain-channel interface 142 of the TFT 100. Further, the bodies of supplementary material 126, 146 are also omitted. The other components of the TFT 400 are substantially the same as the TFT 100. The description of the TFT 100 may be referenced.

Figure 5:
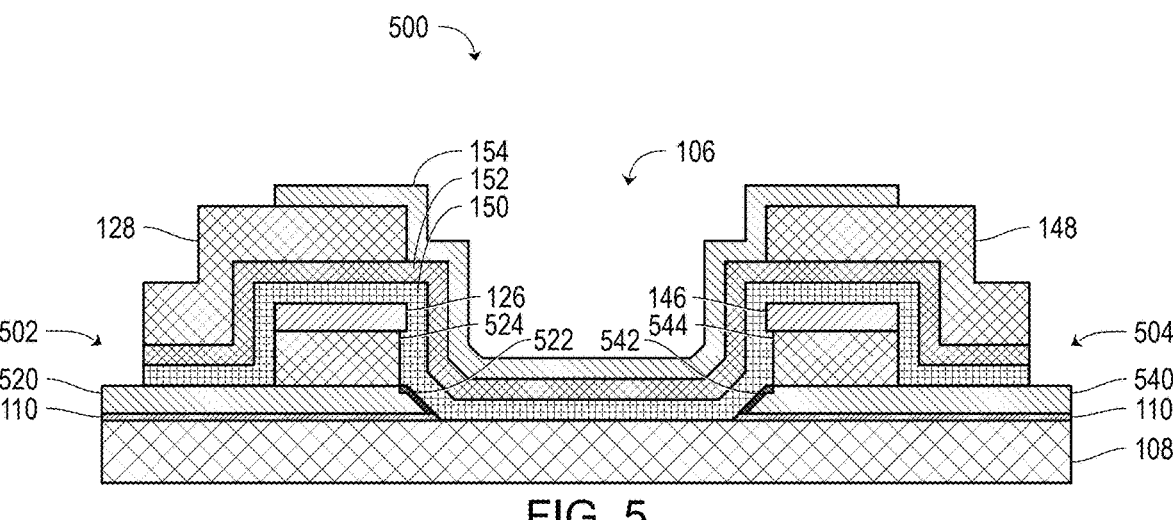
FIG. 5 is a cross-sectional view of another example thin-film transistor in accordance with the present invention.

FIG. 5 shows another example TFT 500 that embodies at least some of the above-described principles of the present invention. In this example, a source 502 includes source material 520 that has an inclined surface on which a source-channel interface 522 is formed. Further, a drain 504 includes drain material 520 that has an inclined surface on which a drain-channel interface 542 may be formed. Such inclined structures may be a result of etching and other forming processes. Other features of the source/drain mate-rials 520, 540 and channel interface 542, 542 may be the same as discussed above for the TFT 100.

In addition, a source-side capacitance-tuning material 524 and drain-side capacitance-tuning material 544, if used, may be etched back with respect to the respective supplementary material 126, 146. That is, the body of supplementary material 126, 146 may overhang the respective body of capacitance-tuning material 524, 544. Such overhang may be the result of etching and other forming processes. Other features of the bodies of capacitance-tuning material 524, 544 may be the same as discussed above for the TFT 100.

The inclined structures of the source material 520, source-channel interface 522, drain material 540, and drain-channel interface 542 can advantageously increase the contact area with the semiconductor channel material 150. Further, such inclined structures, which may be unavoidable and/or unpredictable due to etching and/or other processes used, illustrate the difficulty in aligning the source/drain to the gate, as discussed above with regard to FIG. 2A.

Auxiliary verbs "can" and "may" are used interchangeably herein to denote components, features, and/or aspects of the present invention that are capable, configurable, selectable, modifiable, or optional, as would be apparent to one of ordinary skill in the art given the benefit of this disclosure. These terms should not be taken as limiting the present invention, unless otherwise specified.

Spatial prepositions, such as "over", "under", "above", "below", "up", "down", "beside", etc., are provided for sake of explanation and should not be taken as limiting the present invention to an absolute spatial orientation or arrangement, unless otherwise specified. For example, one of ordinary skill in the art would understand that a first element is above or below a second element depending on the perspective of the observer.

The articles "a", "an", "the", "said", etc. indicate singular and plural, unless otherwise specified.

The conjunction "or" is used inclusively and should be understood to mean "and/or", unless otherwise specified.

Sets of elements A, B, C described as A, B, or C; A, B, and C; A, B, and/or C; or A, B, C should be considered open sets from which one or more elements or a combination of one or more elements may be selected, unless otherwise specified. Sets of elements are open, unless specified to be closed, for example, by use of the term "consist", "consisting", or similar closed language.

The above clarifications apply to both the specification and claims.

The figures are not to scale, unless otherwise specified.

The above-described embodiments of the invention are intended to be examples of the present invention and alterations and modifications may be effected thereto, by those of skill in the art, without departing from the scope of the invention which is defined solely by the claims appended hereto.

The invention claimed is:

1. A thin-film transistor comprising a stack of layers formed of:
a layer of source material;
a layer of capacitance-tuning material formed over and in contact with the layer of source material;
a layer of semiconductor channel material formed over at least the layer of capacitance-tuning material, the layer of semiconductor channel material in contact with the layer of source material;
a layer of gate dielectric material formed over and in contact with the layer of semiconductor channel material;
a layer of encapsulation material formed over and in contact with the layer of gate dielectric material; and
a layer of conductive gate material formed over and in contact with the layer of encapsulation material;
wherein a capacitance between the layer of source material and the layer of gate material is dependent on properties of at least the layer of gate dielectric material, the layer of capacitance-tuning material, and the layer of encapsulation material; and
wherein at least one property of the layer of capacitance-tuning material is selected to control the capacitance between the layer of source material and the layer of gate material.

2. The thin-film transistor of claim 1, wherein the at least one property of the layer of capacitance-tuning material is selected to reduce the capacitance between the layer of source material and the layer of gate material.

3. The thin-film transistor of claim 1, wherein the layer of capacitance-tuning material comprises silicon dioxide.

4. The thin-film transistor of claim 1, further comprising a layer of reducing material formed over and in contact with the layer of capacitance-tuning material, wherein the layer of reducing material is configured to draw oxygen out of another material of the thin-film transistor.

5. The thin-film transistor of claim 4, wherein the layer of reducing material is in contact with the layer of semiconductor channel material.

6. The thin-film transistor of claim 1, further comprising:
a layer of drain material;
another layer of capacitance-tuning material formed over and in contact with the layer of drain material;
another layer of encapsulation material formed over and in contact with the layer of gate dielectric material; and
wherein a capacitance between the layer of drain material and the layer of gate material is dependent on properties of at least the layer of gate dielectric material, the other layer of capacitance-tuning material, and the other layer of encapsulation material; and
wherein at least one property of the other layer of capacitance-tuning material is selected to control the capacitance between the layer of drain material and the layer of gate material.

7. A method of making a thin-film transistor, the method comprising forming a stack of layers by:
forming a layer of source material;
forming a layer of capacitance-tuning material in contact with the layer of source material;
forming a layer of semiconductor channel material over at least the layer of capacitance-tuning material, the layer of semiconductor channel material in contact with the layer of source material;
forming a layer of gate dielectric material over and in contact with the layer of semiconductor channel material;
forming a layer of encapsulation material over and in contact with the layer of gate dielectric material; and
forming a layer of conductive gate material over and in contact with the layer of encapsulation material;
wherein a capacitance between the layer of source material and the layer of gate material is dependent on properties of at least the layer of gate dielectric material, the layer of capacitance-tuning material, and the layer of encapsulation material; and
wherein at least one property of the layer of capacitance-tuning material is selected to control the capacitance between the layer of source material and the layer of gate material.

8. The method of claim 7, wherein the at least one property of the layer of capacitance-tuning material is selected to reduce the capacitance between the layer of source material and the layer of gate material.

9. The method of claim 7, wherein forming the layer of capacitance-tuning material comprises forming a layer of silicon dioxide using atomic layer deposition.

10. The method of claim 7, further comprising forming a layer of reducing material over and in contact with the layer of capacitance-tuning material, wherein the layer of reducing material is configured to draw oxygen out of another material of the thin-film transistor.

11. The method of claim 7, further comprising forming a layer of mask material on the layer of capacitance-tuning material, wherein the layer of mask material is used to etch the capacitance-tuning material to form the layer of capacitance-tuning material and/or to etch the source material to form the layer of source material.

12. The method of claim 11, wherein the layer of mask material remains in the thin-film transistor after the making of the thin-film transistor.

13. The method of claim 11, wherein the layer of mask material is formed between the layer of capacitance-tuning material and the layer of semiconductor channel material.

14. The method of claim 7, further comprising:
forming a layer of drain material;
forming another layer of capacitance-tuning material over and in contact with the layer of drain material;
forming another layer of encapsulation material over and in contact with the layer of gate dielectric material; and
wherein a capacitance between the layer of drain material and the layer of gate material is dependent on properties of at least the layer of gate dielectric material, the other layer of capacitance-tuning material, and the other layer of encapsulation material; and wherein at least one property of the other layer of capacitance-tuning material is selected to control the capacitance between the layer of drain material and the layer of gate material.

15. The thin-film transistor of claim 1, wherein at least one property of the layer of encapsulation material is selected to further control the capacitance between the layer of source material and the layer of gate material.

16. The thin-film transistor of claim 15, wherein at least one property of the layer of encapsulation material is selected to reduce the capacitance between the layer of source material and the layer of gate material.

17. The method of claim 7, wherein at least one property of the layer of encapsulation material is selected to further control the capacitance between the layer of source material and the layer of gate material.

18. The method of claim 17, wherein at least one property of the layer of encapsulation material is selected to reduce the capacitance between the layer of source material and the layer of gate material.

* * * * *